United States Patent
Chen et al.

(10) Patent No.: US 10,248,149 B2
(45) Date of Patent: Apr. 2, 2019

(54) BIAS CIRCUIT

(71) Applicant: RICHWAVE TECHNOLOGY CORP., Taipei (TW)

(72) Inventors: Chih-Sheng Chen, Taipei (TW); Tien-Yun Peng, Taipei (TW); Jhao-Yi Lin, Taipei (TW)

(73) Assignee: RichWave Technology Corp., Taipei (TW)

( * ) Notice: Subject to any disclaimer, the term of this patent is extended or adjusted under 35 U.S.C. 154(b) by 0 days.

(21) Appl. No.: 15/839,189

(22) Filed: Dec. 12, 2017

(65) Prior Publication Data

US 2018/0275709 A1 Sep. 27, 2018

(30) Foreign Application Priority Data

Mar. 24, 2017 (TW) .............................. 106109956 A (51) Int. Cl.
| | | |
|---|---|---|
| *H03K 17/56* | (2006.01) | |
| *G05F 3/16* | (2006.01) | |
| *H03F 5/00* | (2006.01) | |
| *H03F 1/30* | (2006.01) | |
| *H01L 27/06* | (2006.01) | |
| *H03F 1/22* | (2006.01) | |

(52) U.S. Cl.
CPC ............ *G05F 3/16* (2013.01); *H01L 27/0629* (2013.01); *H03F 1/223* (2013.01); *H03F 1/301* (2013.01); *H03F 1/302* (2013.01); *H03F 5/00* (2013.01); *H03F 2200/18* (2013.01); *H03F 2200/21* (2013.01); *H03F 2200/294* (2013.01); *H03F 2200/451* (2013.01)

(58) Field of Classification Search
CPC ....... H01L 2924/00; H01L 2924/00014; H01L 2924/13091; H01L 2225/48091
See application file for complete search history.

(56) References Cited

U.S. PATENT DOCUMENTS

| | | | |
|---|---|---|---|
| 5,532,578 A | 7/1996 | Lee | |
| 6,304,130 B1 | 10/2001 | Poulin et al. | |
| 7,092,692 B2 | 8/2006 | Tan et al. | |
| 7,936,208 B2 | 5/2011 | Pitt | |
| 2003/0076145 A1 | 4/2003 | Mawet | |
| 2016/0070288 A1* | 3/2016 | Ishimaru ................... G05F 3/16 323/312 |

FOREIGN PATENT DOCUMENTS

| | | |
|---|---|---|
| CN | 102265402 B | 4/2015 |
| EP | 0356020 B1 | 9/1994 |
| EP | 0910820 B1 | 10/2001 |
| WO | WO 2007/043106 A1 | 4/2007 |
| WO | WO 2014/199240 A2 | 12/2014 |

* cited by examiner

*Primary Examiner* — Sibin Chen
(74) *Attorney, Agent, or Firm* — Winston Hsu (57) ABSTRACT

A bias circuit includes a first transistor, a second transistor, a first resistor and a second resistor. The first end of the first transistor is coupled to a first voltage source. One end of the first resistor is coupled to the second end of the first transistor, and the other end of the first resistor is coupled to the control terminal of the first transistor. The first end of the second transistor is coupled to a second voltage source, and the second end of the second transistor is coupled to the control terminal of the first transistor. One end of the second resistor is coupled to the other end of the first resistor, and the other end of the second resistor is coupled to the control terminal of the second transistor.

19 Claims, 6 Drawing Sheets

BIAS CIRCUIT

CROSS REFERENCE TO RELATED APPLICATION

This application claims priority benefit of Taiwan application serial No. 106109956, filed on Mar. 24, 2017.

TECHNICAL FIELD

The present disclosure relates to a bias circuit; in particular, to a bias circuit that can provide a stable reference voltage or a stable bias current.

BACKGROUND

Generally, in an integrated circuit, if a bias circuit is produced by using the Silicon on Insulator (SOI) process or the CMOS process, an operation amplifier is configured to lock the generated reference voltage at a voltage that is required by a load circuit. It is easy and common for a bias circuit to be produced by using the SOI process. However, it is difficult to produce the design of a bias circuit by using a III-V fabrication process due to the configuring of an operation amplifier. Even though a bias circuit can be successfully produced by using the III-V process, this bias circuit would have a complicated structure and a larger circuit area, it would thus be uneconomical to have this bias circuit in a chip.

SUMMARY

The present disclosure provides a bias circuit. This bias circuit includes a first transistor, a second transistor, a first resistor and a second resistor. The first end of the first transistor is coupled to a first voltage source. One end of the first resistor is coupled to the second end of the first transistor, and the other end of the first resistor is coupled to the control terminal of the first transistor. The first end of the second transistor is coupled to a second voltage source, and the second end of the second transistor is coupled to the control terminal of the first transistor. One end of the second resistor is coupled to the other end of the first resistor, and the other end of the second resistor is coupled to the control terminal of the second transistor For further understanding of the present disclosure, reference is made to the following detailed description illustrating the embodiments of the present disclosure. The description is only for illustrating the present disclosure, not for limiting the scope of the claim.

BRIEF DESCRIPTION OF THE DRAWINGS

Embodiments are illustrated by way of example and not by way of limitation in the figures of the accompanying drawings, in which like references indicate similar elements and in which.

DETAILED DESCRIPTION OF EXEMPLARY EMBODIMENTS

The aforementioned illustrations and following detailed descriptions are exemplary for the purpose of further explaining the scope of the present disclosure. Other objectives and advantages related to the present disclosure will be illustrated in the subsequent descriptions and appended drawings. In these drawings, like references indicate similar elements.

One Embodiment of the Bias Circuit

Figure 1A:
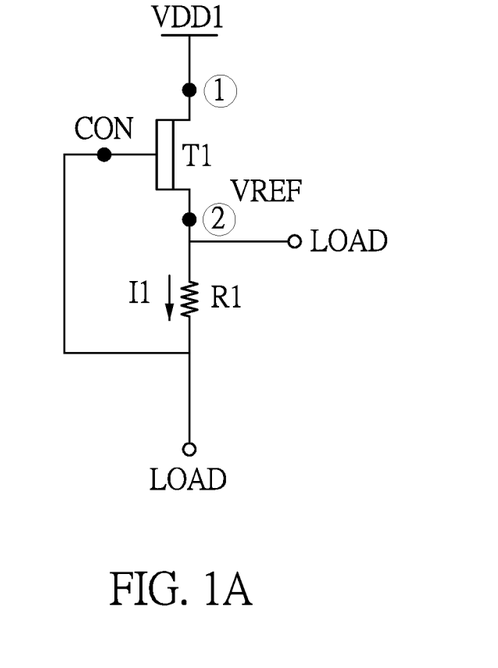
FIG. 1A and FIG. 1B show circuit diagrams of a bias circuit of embodiments of the present disclosure.
Figure 1B:
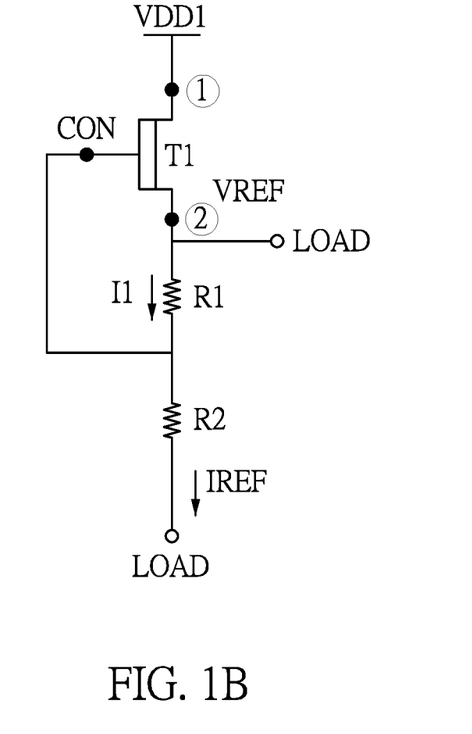

Referring to FIG. 1A and FIG. 1B, circuit diagrams of a bias circuit of embodiments of the present disclosure are shown. The bias circuit provided by this embodiment has a simple structure which makes it less difficult and less complex to produce the bias circuit by using a III-V fabrication process. In addition, since this bias circuit has a small circuit area, it is economical to have this bias circuit in a chip.

As shown in FIG. 1A, the bias circuit includes a first transistor T1 and a first resistor R1. The first end of the first transistor T1 is coupled to a first voltage source VDD1. One end of the first resistor R1 is coupled to the second end of the first transistor T1, and the other end of the first resistor R1 is coupled to the control terminal of the first transistor T1. For ease of illustration, in FIG. 1, the first end of the first transistor T1 is marked by ①, the second end of the first transistor T1 is marked by ②, and the control terminal of the first transistor T1 is marked by CON. In addition, a depletion mode transistor is taken as an example of the first transistor T1 in the following description, wherein the first end of the first transistor T1 is drain, the second end of the first transistor T1 is source and the control terminal of the first transistor T1 is gate.

The following description is for illustrating the working principle of the bias circuit of this embodiment. When the first transistor T1 is turned on by the first voltage source VDD1, a first current I1 flows through the first transistor T1. This first current I1 flows through the first resistor R1 such that a voltage is generated at a first node between the second end of the first transistor T1 and one end of the first resistor R1. It should be noted that, the first node between the second end of the first transistor T1 and one end of the first resistor R1 can be coupled to a load circuit LOAD. Thus, the voltage generated at the first node between the second end of the first transistor T1 and one end of the first resistor R1 can be a reference voltage VREF provided to the load circuit LOAD. In this case, the first current I1 is a bias current IREF provided to the load circuit LOAD.

It should be noted that, the circuit configuration shown in FIG. 1A is the simplest structure of the bias circuit provided by the present disclosure. As mentioned, the reference voltage VREF provided to the load circuit LOAD is the voltage at the first node between the second end of the first transistor T1 and one end of the first resistor R1. According to FIG. 1A, the reference voltage VREF should be equal to the sum of a voltage drop between the load circuit LOAD and a reference potential (such as common node or ground), and the product of the first current I1 and the first resistor R1. As shown, only a first resistor R1 is configured in the bias circuit in FIG. 1A, so that load circuit cannot be provided a large reference voltage VREF by this bias circuit.

In order to provide a larger reference voltage VREF to the load circuit LOAD, a second resistor R2 can be further configured in the bias circuit provided by this embodiment. As shown in FIG. 1B, one of the second resistor R2 is coupled to the other end of the first resistor R1 and the control terminal of the first transistor T1. According to FIG. 1B, the reference voltage VREF should be equal to the sum of a voltage drop between the load circuit LOAD and the reference potential, the product of the first current I1 and the first resistor R1, and the product of the first current I1 and the second resistor R2. In this case, the load circuit LOAD can be provided a larger reference voltage VREF by the bias circuit.

It should be noted that, in FIG. 1B, two ends of the first resistor R1 and the second end and the control terminal of the first transistor T1 form a loop. Thus, according to the Kirchhoff Circuit Laws, the voltage drop between the second end and the control terminal of the first transistor T1 should be equal to the product of the first current I1 and the first resistor R1. In other words, the voltage drop generated when the first current I1 flows through the first resistor R1 is the gate-to-source voltage of the first transistor T1. Thus, the design of the bias circuit in FIG. 1B allows the voltage drop across the first resistor R1 to be determined by the gate-to-source voltage of the first transistor T1, even though the actual resistance and the ideal resistance of the first resistor R1 may be slightly different due to the uncontrollable variables within its production process.

However, in FIG. 1B, the reference voltage VREF should be the sum of the voltage drop between the load circuit LOAD and the reference potential, the product of the first current I1 and the first resistor R1, and the product of the first current I1 and the second resistor R2. Thus, the reference voltage VREF may vary because the actual resistance and the ideal resistance of the second resistor R2 may be slightly different due to the uncontrollable variables within its production process. As a result, the reference voltage VREF provided by this bias circuit may still be unstable.

Therefore, in order to provide a large enough reference voltage VREF to the load circuit LOAD and to keep the reference voltage VREF stable without an influence generated by the slight difference between the actual resistance and the ideal resistance of the second resistor R2, more embodiments are provided in the following description for illustrating the bias circuit provided by the present disclosure.

Another Embodiment of the Bias Circuit

Figure 2A:
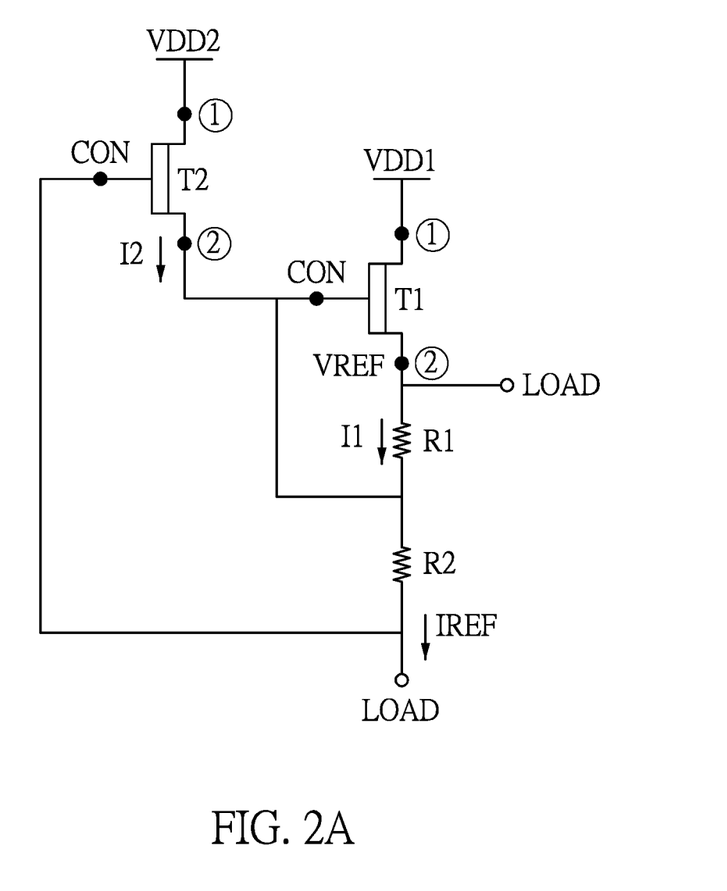
FIG. 2A shows a circuit diagram of a bias circuit of another embodiment of the present disclosure.

Referring to FIG. 2A, a circuit diagram of a bias circuit of another embodiment of the present disclosure is shown. The bias circuit provided by this embodiment also has a simple structure which makes it less difficult and less complex to produce the circuit by using a III-V fabrication process. In addition, this bias circuit also has a smaller circuit area, and thus it is economical to have this bias circuit in a chip.

As shown in FIG. 2A, the bias circuit at least includes a first transistor T1, a second transistor T2, a first resistor R1 and a second resistor R2. The first end of the first transistor T1 is coupled to a first voltage source VDD1. One end of the first resistor R1 is coupled to the second end of the first transistor T1, and the other end of the first resistor R1 is coupled to the control terminal of the first transistor T1. The first end of the second transistor T2 is coupled to a second voltage source VDD2, and the second end of the second transistor T2 is coupled to the control terminal of the first transistor T1. One end of the second resistor R2 is coupled to the other end of the first resistor R1, and the other end of the second resistor R2 is coupled to the control terminal of the second transistor T2. For ease of illustration, in FIG. 2A, the first end of each transistor is marked by ①, the second end of each transistor is marked by ②, and the control terminal of each transistor is marked by CON.

The working principle of the bias circuit provided by this embodiment is illustrated in the following description. This bias circuit can generate a stable reference voltage and a stable bias current according to the operation requirements of a load circuit, such that the load circuit can work normally with a proper reference voltage and a proper bias current.

According to FIG. 2A, when the first transistor T1 is turned on by the first voltage source VDD1, a first current I1 flows through the first transistor T1. Similarly, when the second transistor T2 is turned on by the second voltage source VDD2, a second current I2 flows through the second transistor T2. The first current I1 flows through the first resistor R1, and the first current I1 and the second current I2 flow through the second resistor R2, such that a voltage is generated at a first node between the second end of the first transistor T1 and one end of the first resistor R1. A load circuit LOAD can be coupled to the first node between the second end of the first transistor T1 and one end of the first resistor R1. In this case, the reference voltage VREF provided to the load circuit LOAD by the bias circuit is the voltage at the first node between the second end of the first transistor T1 and one end of the first resistor R1. In this embodiment, the voltage at the second end of the first transistor T1 is larger than the voltage at the control terminal of the first transistor T1, and the voltage at the second end of the second transistor T2 is larger than the voltage at the control terminal of the second transistor T2. In another embodiment, the bias circuit can directly output the reference voltage VREF to another load circuit.

Figure 2B:
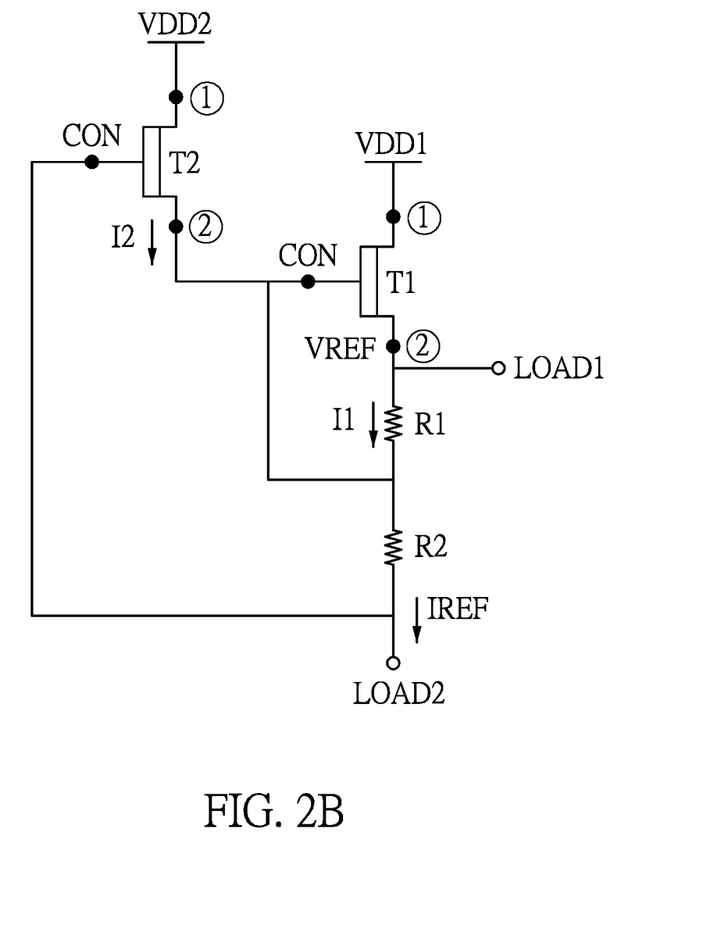
FIG. 2B shows a circuit diagram of a bias circuit of the other embodiment of the present disclosure.

According to the reference voltage VREF, a bias current IREF can be provided to the load circuit LOAD from a second node between the control terminal of the second transistor T2 and the other end of the second resistor R2. Specifically, this bias current IREF is the sum of the first current I1 and the second current I2. In one embodiment, the load circuit LOAD is an amplifier circuit, such as a power amplifier or a LNA. The bias current IREF is provided to the amplifier circuit as a current source, and the reference voltage VREF is provided to the amplifier circuit as a bias voltage. In another embodiment as shown in FIG. 2B, the reference voltage VREF is provided to a second load circuit LOAD1, and the bias current IREF is provided to a first load circuit LOAD2.

Due to the described circuit design, one of advantages of this bias circuit is that, when the first transistor T1 and the second transistor T2 work normally, if the voltage of the first voltage source VDD1 or the voltage of the second voltage source VDD2 varies, the current values of the first current I1 flowing through the first resistor R1, the second current I2 flowing through the second resistor R2 and the bias current IREF can be maintained. Thus, the bias circuit provided by this embodiment can provide a stable bias current IREF to the load circuit LOAD.

At a glance, it may seem that in this bias circuit, when the voltage of the first voltage source VDD1 or the voltage of the second voltage source VDD2 varies, the voltage at the first node between the second end of the first transistor T1 and one end of the first resistor R1 may be affected, which would make the bias current IREF vary.

However, this is less than likely to occur with the bias circuit provided by this embodiment for the following reasons. In the bias circuit provided by this embodiment, two ends of the first resistor R1 and the second end and the control terminal of the first transistor T1 form a loop. Two ends of the second resistor R2 and the second end and the control terminal of the second transistor T2 also form a loop. According to the Kirchhoff Circuit Laws, the voltage drop between the second end and the control terminal of the first transistor T1 should be equal to the product of the first current I1 and the first resistor R1, and the voltage drop between the second end and the control terminal of the second transistor T2 should be equal to the product of the second resistor R2 and the sum of the first current I1 and the second current I2.

For ease of illustration, depletion mode transistors are taken as examples of the first transistor T1 and the second transistor T2, wherein the first end of the first transistor T1 and the first end of the second transistor T2 are drains, the second end of the first transistor T1 and the second end of the second transistor T2 are sources, and the control terminal of the first transistor T1 and the control terminal of the second transistor T2 are gates. In the bias circuit provided by this embodiment, two ends of the first resistor R1 and the source and the gate of the first transistor T1 form a loop, and two ends of the second resistor R2 and the source and the gate of the second transistor T2 also form a loop. Thus, according to the Kirchhoff Circuit Laws, the voltage drop between the source and the gate of the first transistor T1 should be equal to the product of the first current I1 and the first resistor R1 (which can be represented by Equation 1 as set forth below), and the voltage drop between the source and the gate of the second transistor T2 should be equal to the product of the second resistor R2 and the sum of the first current I1 and the second current I2 (which can be represented by Equation 2 as set forth below).

$$VGS1 + I1 \times R1 = 0 \quad \text{(Equation 1)}$$

$$VGS2 + (I1 + I2) \times R2 = 0 \quad \text{(Equation 2)}$$

In the Equation 1 and the Equation 2, VGS1 is the gate-to-source voltage of the first transistor T1, and the VGS2 is the gate-to-source voltage of the second transistor T2.

When the first transistor T1 and the second transistor T2 work normally, i.e. the first transistor T1 and the second transistor T2 were operated at the saturation regions, the first current I1 can be constant and the second current I2 can also be constant. In this case, the first current I1 is related to the gate-to-source voltage of the first transistor T1 and the threshold voltage of the first transistor T1, and the second current I2 is related to the gate-to-source voltage of the second transistor T2 and the threshold voltage of the second transistor T2. According to the I-V characteristics of the deletion mode transistor, it can be obtained that:

$$I1 = \frac{1}{2} \times \mu_0 \times C_{ox} \times (W/L) \times (VGS1 - VTH)^2 \quad \text{(Equation 3)}$$

$$I2 = \frac{1}{2} \times \mu_0 \times C_{ox} \times (W/L) \times (VGS2 - VTH)^2 \quad \text{(Equation 4)}$$

In the Equation 3 and the Equation 4, VTH is the threshold voltages of the first transistor T1 and the second transistor T2, $\mu_0$ is the Carrier Mobility, W is the width of the gate of the deletion mode transistor, L is the length of the gate of the deletion mode transistor, and the $C_{ox}$ is the unit capacitance of the gate oxide layer.

Based on the Equation 3 and the Equation 4, VGS1 and VGS2 can be represented by the Equation 5 and the Equation 6 as set forth below.

$$VGS1 = (I1/K)^{1/2} + VTH \quad \text{(Equation 5)}$$

$$VGS2 = (I2/K)^{1/2} + VTH \quad \text{(Equation 6)}$$

In the Equation 5 and the Equation 6, $K = \frac{1}{2} \times \mu_0 \times C_{ox} \times (W/L)$.

Based on the Equation 1 and the Equation 5, a quadratic equation related to the first current I1 can be represented by the Equation 7 as set forth below.

$$(I1/K)^{1/2} + VTH + I1 \times R1 = 0 \quad \text{(Equation 7)}$$

In the Equation 7, R1, VTH and K are constant, so it is indicated that I1 is also constant. Thus, the first current I1 is not related to the first voltage source VDD1.

Similarly, based on the Equation 2 and the Equation 6, a quadratic equation related to the second current I2 can be represented by the Equation 8 as set forth below.

$$(I2/K)^{1/2} + VTH + I1 \times R1 + I2 \times R2 = 0 \quad \text{(Equation 8)}$$

In the Equation 8, R2, VTH and K are constant, thus indicating that I2 is also constant. Therefore, the second current I2 is not related to the second voltage source VDD2.

According to the above derivations of the Equations 1~8, it can be shown that as long as the voltage of the first voltage source VDD1 and the voltage of the second voltage source VDD2 are sufficient for the first transistor T1 and the second transistor T2 to work in their saturation regions, the first current I1 flowing through the first resistor R1 and the second current I2 flowing through the second resistor R2 can be irrelevant to the voltage of the first voltage source VDD1 or the voltage of second voltage source VDD2. In other words, as long as the first transistor T1 and the second transistor T2 can keep working in their saturation regions, the voltage of the first voltage source VDD1 or the voltage of second voltage source VDD2 is allowed to vary. Thus, the values of the first current I1 and the second current I2 can hardly be affected by the variation of the voltage of the first voltage source VDD1 or the voltage of second voltage source VDD2.

It should be noted that, in this embodiment, the voltage of the first voltage source VDD1 and the voltage of second voltage source VDD2 can be equal or unequal to each other.

Another advantage of the bias circuit in this embodiment is that, even though the actual resistance and the ideal resistance of the first resistor R1 may be slightly different and the actual resistance and the ideal resistance of the second resistor R2 may be slightly different due to the uncontrollable variables within their production process, due to the circuit design of this bias circuit, the reference voltage VREF can be determined only by the voltage difference between the control terminal and the second end of the first transistor T1 and the voltage difference between the control terminal and the second end of the second transistor T2.

According to FIG. 2A, it may seem that the reference voltage VREF is the sum of the voltage of the load circuit LOAD, the product of the first current I1 and the first resistor R1 and the product of the second resistor R2 and the sum of the first current I1 and the second current I2. Thus, if the actual resistance and the ideal resistance of the first resistor R1 are slightly different or the actual resistance and the ideal resistance of the second resistor R2 are slightly different, the reference voltage VREF may not be provided as required by the load circuit LOAD.

However, this is less than likely to occur with the bias circuit provided by this embodiment for the following reasons. Even though the reference voltage VREF is the sum of the voltage of the load circuit LOAD, the product of the first current I1 and the first resistor R1 and the product of the second resistor R2 and the sum of the first current I1 and the second current I2, as mentioned, two ends of the first resistor R1, and the second end and the control terminal of the first transistor T1 form a loop, and two ends of the second resistor R2 and the second end and the control terminal of the second transistor T2 also form a loop. Thus, the voltage drop between the second end and the control terminal of the first transistor T1 should be equal to the product of the first current I1 and the first resistor R1, and the voltage drop between the second end and the control terminal of the second transistor T2 should be equal to the product of the second resistor R2 and the sum of the first current I1 and the second current I2. Accordingly, the reference voltage VREF can be related only to the sum of the voltage drop between the control terminal and the second end of the first transistor T1 and the voltage drop between the control terminal and the second end of the second transistor T2.

In this manner, even if the actual resistance and the ideal resistance of the first resistor R1 may be slightly different and the actual resistance and the ideal resistance of the second resistor R2 may be slightly different due to the uncontrollable variables within their production process, a stable reference voltage VREF can still be provided as required by the load circuit LOAD by the bias circuit in this embodiment.

It should be noted that, in addition to the depletion mode transistor, in this embodiment, the first transistor T1 and the second transistor T2 can also be Depletion Mode Metal-Oxide-Semiconductors, wherein the first ends of the first transistor T1 and the second transistor T2 are drains, the second ends of the first transistor T1 and the second transistor T2 are sources, and the control terminals of the first transistor T1 and the second transistor T2 are gates.

Still Another Embodiment of the Bias Circuit

Figure 3:
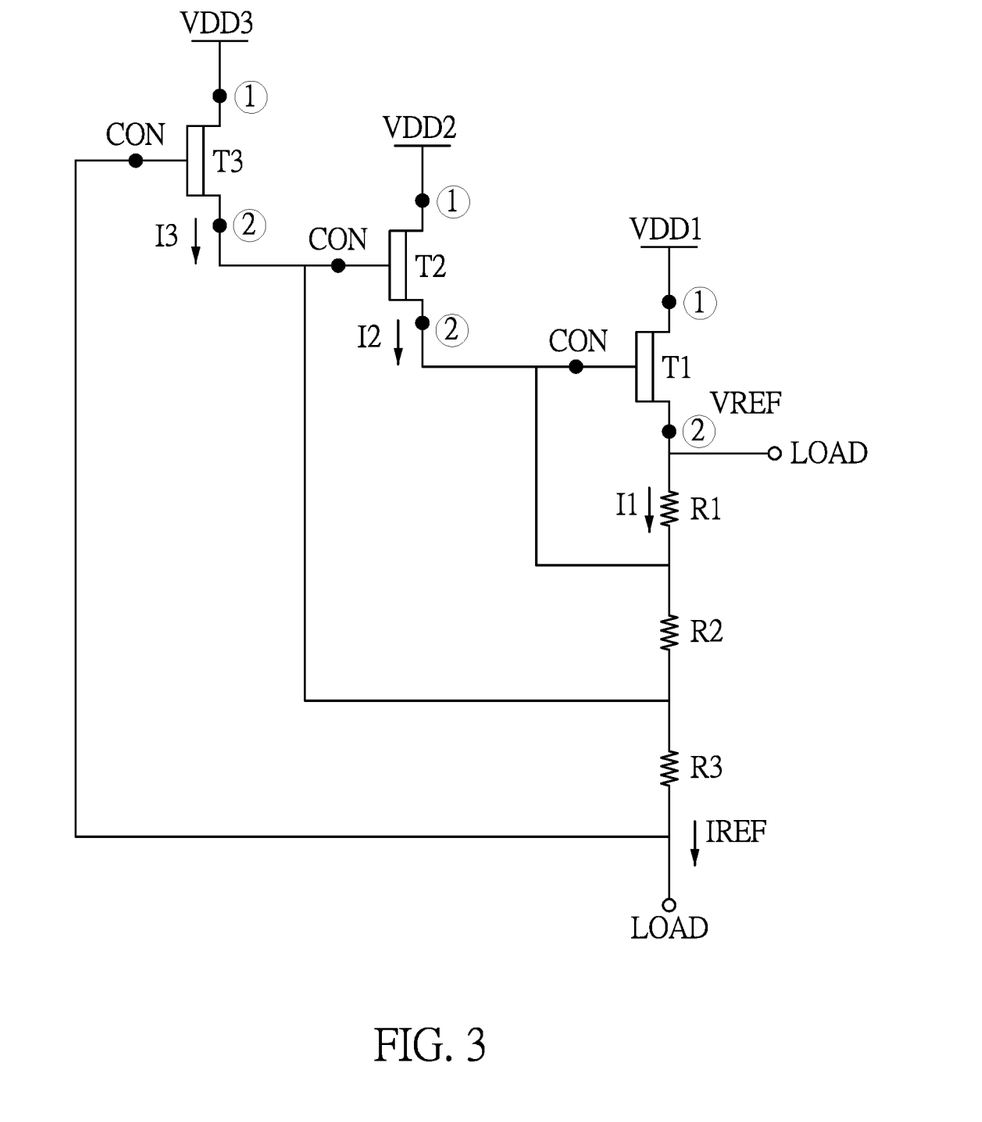
FIG. 3 shows a circuit diagram of a bias circuit of still another embodiment of the present disclosure.

Referring to FIG. 3, a circuit diagram of a bias circuit of still another embodiment of the present disclosure is shown.

The bias circuit provided by this embodiment and the bias circuit shown in FIG. 2A have similar circuit configurations and working principles. The bias circuit provided by this embodiment is designed based on the bias circuit shown in FIG. 2A, and more specifically, the bias circuit provided by this embodiment consists of three or more loops formed by a transistor and a resistor. As shown in FIG. 3, the bias circuit provided by this embodiment includes N transistors T1~TN (the first transistor T1~the $N^{th}$ transistor TN) and N resistors R1~RN (the first resistor R1~the $N^{th}$ resistor RN), wherein N can be any positive integer equal to or larger than 3.

For ease of illustration, in the following description and FIG. 3, it is assumed that the bias circuit provided by this embodiment includes three transistors T1~T3 and (the first transistor T1~the third transistor T3) and three resistors R1~R3 (the first resistor R1~the third resistor R3); in brief, N is 3. As shown in FIG. 3, the bias circuit provided by this embodiment includes a first resistor R1, a second resistor R2 and a third resistor R3. The first end of the first transistor T1 is coupled to a first voltage source VDD1. One end of the first resistor R1 is coupled to the second end of the first transistor T1, and the other end of the first resistor R1 is coupled to the control terminal of the first transistor T1. The first end of the second transistor T2 is coupled to a second voltage source VDD2, and the second end of the second transistor T2 is coupled to the control terminal of the first transistor T1. One end of the second resistor R2 is coupled to the other end of the first resistor R1, and the other end of the second resistor R2 is coupled to the control terminal of the second transistor T2. The first end of the third transistor T3 is coupled to a third voltage source VDD3, and the second end of the third transistor T3 is coupled to the control terminal of the second transistor T2. One end of the third resistor R3 is coupled to the other end of the second resistor R2, and the other end of the third resistor R3 is coupled to the control terminal of the third transistor T3. For ease of illustration, in FIG. 3, the first end of each transistor is marked by ①, the second end of each transistor is marked by ②, and the control terminal of each transistor is marked by CON.

The bias circuit provided by this embodiment can provide a stable reference voltage and a stable bias current according to the operation requirements of a load circuit, such that the load circuit can normally work with a proper reference voltage and a proper bias current.

When the first transistor T1 is turned on by the first voltage source VDD1, a first current I1 flows through the first voltage source VDD1, when the second transistor T2 is turned on by the second voltage source VDD2, a second current I2 flows through the second voltage source VDD2, and when the third transistor T3 is turned on by the third voltage source VDD3, a third current I3 flows through the third voltage source VDD3. A voltage is generated at a first node between the second end of the first transistor T1 and one end of the first resistor R1 when the first current I1 flows through the first resistor R1, the first current I1 and the second current I2 flow through the second resistor R2, and the first current I1, the second current I2 and the third current I3 flow through the third resistor R3. It should be noted that, a load circuit LOAD can be coupled to the first node between the second end of the first transistor T1 and one end of the first resistor R1, so that the reference voltage VREF provided to the load circuit LOAD by the bias circuit in this embodiment is the voltage at the first node between the second end of the first transistor T1 and one end of the first resistor R1. In this embodiment, the voltages at the second ends of the first transistor T1, the second transistor T2 and the third transistor T3 are larger than the voltages at the control terminals of the first transistor T1, the second transistor T2 and the third transistor T3. In another embodiment, the bias circuit can directly output the reference voltage VREF to another load circuit.

According to the reference voltage VREF, a bias current IREF can be provided to the load circuit LOAD a third node between the control terminal of the third transistor T3 and the other end of the third resistor R3. Specifically, this bias current IREF is the sum of the first current I1, the second current I2 and the third current I3.

Similar to the bias circuit shown in FIG. 2A, one of the advantages of the bias circuit provided by this embodiment is that, as long as the first transistor T1, the second transistor T2 and the third transistor T3 work normally, if the voltage of the first voltage source VDD1, the voltage of the voltage source VDD2 or the third voltage source VDD3 varies, the current flowing through the first resistor R1, the current flowing through the second resistor R2, the current flowing through the third resistor R3 and the bias current IREF can be maintained. Therefore, the bias circuit provided by the bias circuit provided by this embodiment can provide a stable bias current to the load circuit LOAD.

In this embodiment, the first transistor T1, the second transistor T2 and the third transistor T3 can be depletion mode transistors. In this case, the first ends of the first transistor T1, the second transistor T2 and the third transistor T3 are drains, the second ends of the first transistor T1, the second transistor T2 and the third transistor T3 are sources, and the control terminals of the first transistor T1, the second transistor T2 and the third transistor T3 are gates.

Similar to the bias circuit shown in FIG. 2A, in this embodiment, after the first transistor T1, the second transistor T2 and the third transistor T3 are turned on respectively by the first voltage source VDD1, the second voltage source VDD2 and the third voltage source VDD3, as long as the voltages of the first voltage source VDD1, the second voltage source VDD2 and the third voltage source VDD3 are sufficient for the first transistor T1, the second transistor T2 and the third transistor T3 to work in their saturation regions, the voltage of the first voltage source VDD1, the voltage of second voltage source VDD2 or the voltage of the third voltage source VDD3 is allowed to vary. Furthermore, the values of the first current I1, the second current I2 and the third current I3 are hardly affected due to the variation of the voltage of the first voltage source VDD1, the voltage of second voltage source VDD2 or the voltage of the third voltage source VDD3. Accordingly, the bias current IREF (the sum of the first current I1, the second current I2 and the third current I3) that this bias circuit can provide will not change with the variation of the voltage of the first voltage source VDD1, the voltage of second voltage source VDD2 or the voltage of the third voltage source VDD3.

It should be noted that, in this embodiment, the voltages of the first voltage source VDD1, the second voltage source VDD2 and the third voltage source VDD3 can be equal or unequal to each other.

Another advantage of the bias circuit in this embodiment is that, even though the actual resistance and the ideal resistance of the first resistor R1, the second resistor R2 or the third resistor R3 may be slightly different due to the uncontrollable variables within their production process, due to the circuit design of this bias circuit, the reference voltage VREF can be determined by the voltage difference between the control terminal and the second end of the first transistor T1, the voltage difference between the control terminal and the second end of the second transistor T2, and the voltage difference between the control terminal and the second end of the third transistor T3.

Specifically speaking, according to FIG. 3, the reference voltage VREF is the sum of the voltage drop between the load circuit LOAD and the reference potential, the product of the first current I1 and the first resistor R1, the product of the second resistor R2 and the sum of the first current I1 and the second current I2, and the product of the third resistor R3 and the sum of the first current I1, the second current I2 and the third current I3. In addition, two ends of the first resistor R1 and the second end and the control terminal of the first transistor T1 form a loop, two ends of the second resistor R2 and the second end and the control terminal of the second transistor T2 form a loop, and two ends of the third resistor R3 and the second end and the control terminal of the third transistor T3 form a loop.

Thus, the voltage drop between the second end and the control terminal of the first transistor T1 should be equal to the product of the first current I1 and the first resistor R1, the voltage drop between the second end and the control terminal of the second transistor T2 should be equal to the product of the second resistor R2 and the sum of the first current I1 and the second I2, and the voltage drop between the second end and the control terminal of the third transistor T3 should be equal to the product of the third resistor R3 and the sum of the first current I1, the second I2 and the third current I3. Accordingly, the reference voltage VREF should be related to the sum of the voltage drop between the second end and the control terminal of the first transistor T1, the voltage drop between the second end and the control terminal of the second transistor T2, and the voltage drop between the second end and the control terminal of the third transistor T3.

In this manner, even if the actual resistance and the ideal resistance of the first resistor R1, the second resistor R2 or the resistor R3 may be slightly different due to the uncontrollable variables within their production process, a stable reference voltage VREF can still be provided as required by the load circuit LOAD by the bias circuit in this embodiment, because the reference voltage VREF is determined only by the voltage drop between the second end and the control terminal of the first transistor T1, the voltage drop between the second end and the control terminal of the second transistor T2, and the voltage drop between the second end and the control terminal of the third transistor T3.

It should be noted that, in this embodiment, the first transistor T1, the second transistor T2 and the third transistor T3 can also be Depletion Mode Metal-Oxide-Semiconductors, wherein the first ends of the first transistor T1, the second transistor T2 and the third transistor T3 are drains, the second ends of the first transistor T1, the second transistor T2 and the third transistor T3 are sources, and the control terminals of the first transistor T1, the second transistor T2 and the third transistor T3 are gates.

Figure 4:
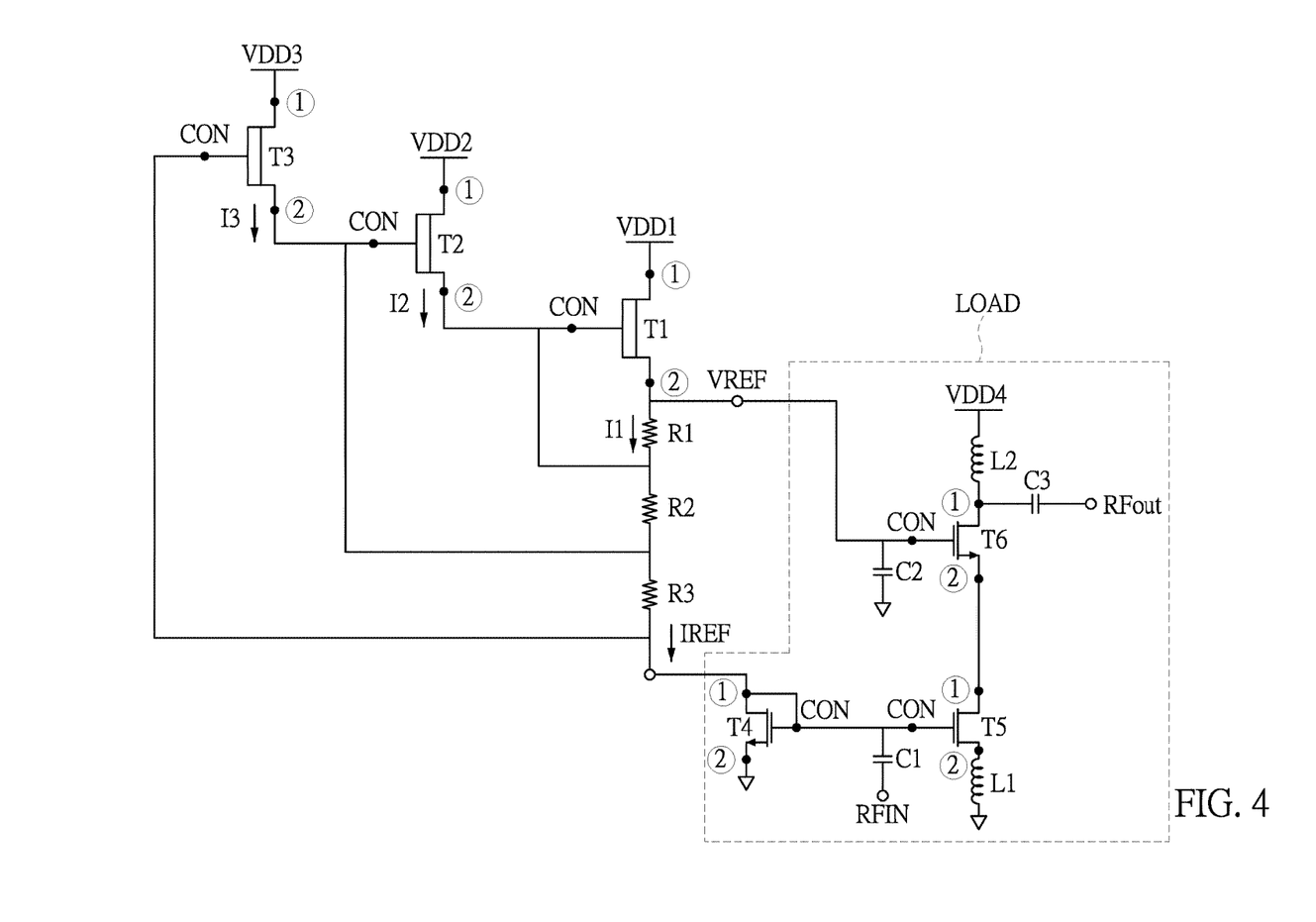
FIG. 4 is a circuit diagram showing how the bias circuit works with a load circuit according to one embodiment of the present disclosure.

FIG. 4 shows a circuit diagram showing how the bias circuit works with a load circuit according to one embodiment of the present disclosure.

As shown in FIG. 4, the load circuit LOAD includes a fourth transistor T4, a fifth transistor T5 and a sixth transistor T6. The first end of the fourth transistor T4 receives the bias current IREF, the second end of the fourth transistor T4 is coupled to the reference potential, and the control terminal of the fourth transistor T4 is coupled to the first end of the fourth transistor T4 and also coupled to the input end of the load circuit LOAD through a first capacitor C1. The control terminal of the sixth transistor T6 is coupled to the reference voltage VREF and is also coupled to the reference potential through a second capacitor C2. The control terminal of the fifth transistor T5 is coupled to the control terminal of the fourth transistor T4. The first end of the fifth transistor T5 is coupled to the second end of the sixth transistor T6, and the second end of the fifth transistor T5 is coupled to the reference potential through a first inductor L1. The first end of the sixth transistor T6 is coupled to a fourth voltage source VDD4 through a second inductor L2 and is also coupled to the output end of the load circuit LOAD through a third capacitor C3. For ease of illustration, in FIG. 4, the first end of the fourth transistor T4, the fifth transistor T5 and the sixth transistor T6 are marked by ①, the second end of the fourth transistor T4, the fifth transistor T5 and the sixth transistor T6 are marked by ②, and the control terminal of the fourth transistor T4, the fifth transistor T5 and the sixth transistor T6 are marked by CON.

In this embodiment, the fourth transistor T4, the fifth transistor T5 and the sixth transistor T6 are NMOS transistors, but it is not limited thereto. The first ends of the fourth transistor T4, the fifth transistor T5 and the sixth transistor T6 are drains, the second ends of the fourth transistor T4, the fifth transistor T5 and the sixth transistor T6 are sources, and the control terminals of the fourth transistor T4, the fifth transistor T5 and the sixth transistor T6 are gates.

The load circuit LOAD may include a cascode low noise amplifier (LNA) including the fifth transistor T5 and the sixth transistor T6, but it is not limited thereto. An RF signal can be inputted to the input end RFin of the load circuit LOAD, then be amplified by the LNA, and finally be outputted from the output end RFout of the load circuit LOAD. The reference voltage VREF provided by the bias circuit is applied to the control terminal of the sixth transistor T6. The bias current IREF provided by the bias circuit is applied to the first end of the fourth transistor T4, and then the bias current IREF will be mirrored to the fifth transistor T5 to drive the LNA.

It should be noted that, the bias circuit shown in FIG. 4 is similar to the bias circuit shown in FIG. 3; however, the bias circuit shown in FIG. 2 can also work with the load circuit LOAD in this embodiment.

To sum up, the bias circuit provided by each embodiment of the present disclosure mainly includes loops consisted of transistors and resistors. Based on this kind of circuit design, problems that may be solved by the present disclosure and the advantages of the present disclosure are as follows.

Firstly, as long as each transistor in the bias circuit can work normally (for example, if each transistor is the depletion mode transistor, working normally indicates that the depletion mode transistor works within its saturation region), the current flowing through each resistor can be maintained even when the voltage of the voltage source of any one transistor varies. Thus, the bias circuit of the present disclosure can provide a stable bias current to a load circuit.

Moreover, even though the actual resistance and the ideal resistance of each resistor may be slightly different due to the uncontrollable variables within its production process, due to the circuit design of the bias circuit of the present disclosure, a reference voltage that the bias circuit provides to a load circuit is determined by the voltage difference between the control terminal and the second end of each transistor. Thus, the bias circuit of the present disclosure can provide a stable reference voltage to keep the load circuit operating normally.

The descriptions illustrated supra set forth simply the preferred embodiments of the present disclosure; however, the characteristics of the present disclosure are by no means restricted thereto. All changes, alterations, or modifications conveniently considered by those skilled in the art are deemed to be encompassed within the scope of the present disclosure delineated by the following claims.

What is claimed is:

1. A bias circuit, comprising:
   a first transistor, wherein a first end of the first transistor is coupled to a first voltage source;
   a first resistor, having one end coupled to a second end of the first transistor, having the other end coupled to a control terminal of the first transistor;
   a second transistor, wherein a first end of the second transistor is coupled to a second voltage source, and a second end of the second transistor is coupled to the control terminal of the first transistor; and
   a second resistor, having one end coupled to the other end of the first resistor, having the other end coupled to a control terminal of the second transistor,
   wherein a reference voltage is generated at a first node between the second end of the first transistor and the one end of the first resistor, and the reference voltage is related to a sum of a voltage drop between the control terminal and the second end of the first transistor and a voltage drop between the control terminal and the second end of the second transistor.

2. The bias circuit according to claim 1, wherein when the first transistor is turned on by the first voltage source and the second transistor is turned on by the second voltage source, a first current flows through the first transistor and a second current flows through the second transistor, the reference voltage is generated when the first current flows through the first resistor and the first current and the second current flow through the second resistor, and a bias current is generated at a second node between the control terminal of the second transistor and the other end of the second resistor.

3. The bias circuit according to claim 2, wherein after the first transistor is turned on by the first voltage source and the second transistor is turned on by the second voltage source, when the voltage of the first voltage source or the voltage of the second voltage source varies, the current values of the first current, the second current and the bias current are maintained.

4. The bias circuit according to claim 2, wherein the reference voltage is provided to a load circuit.

5. The bias circuit according to claim 2, wherein when the first transistor is turned on by the first voltage source and the second transistor is turned on by the second voltage source, the voltage at the second end of the first transistor and the voltage at the second end of the second transistor are larger than the voltage at the control terminal of the first transistor and larger than the voltage at the control terminal of the second transistor.

6. The bias circuit according to claim 5, wherein the first transistor and the second transistor are depletion mode transistors, the first end of the first transistor and the first end of the second transistor are drains, the second end of the first transistor and the second end of the second transistor are sources, and the control terminal of the first transistor and the control terminal of the second transistor are gates.

7. The bias circuit according to claim 2, wherein the voltage of the first voltage source and the voltage of the second voltage source are equal or unequal to each other.

8. The bias circuit according to claim 2, wherein the reference voltage is provided to a first load circuit at the first node, and the bias current is outputted to a second load circuit from the second node.

9. The bias circuit according to claim 1, wherein the reference voltage is provided to a load circuit at the first node.

10. The bias circuit according to claim 1, further comprising:
    a third transistor, wherein a first end of the third transistor is coupled to a third voltage source, and a second end of the third transistor is coupled to the control terminal of the second transistor; and
    a third resistor, having one end coupled to the other end of the second resistor, having the other end coupled to a control terminal of the third transistor;
    wherein when the first transistor is turned on by the first voltage source, the second transistor is turned on by the second voltage source and the third transistor is turned on by the third voltage source, a first current flows through the first transistor, a second current flows through the second transistor and a third current flows through the third transistor, the reference voltage is generated when the first current flows through the first resistor, the first current and the second current flow through the second resistor, and the first current, the second current and the third current flow through the third resistor, and a bias current is generated at a third node between the control terminal of the third transistor and the other end of the third resistor.

11. The bias circuit according to claim 10, wherein after the first transistor is turned on by the first voltage source, the second transistor is turned on by the second voltage source and the third transistor is turned on by the third voltage source, when the voltage of the first voltage source, the voltage of the second voltage source or the voltage of the third voltage source varies, the current values of the first current, the second current, the third current and the bias current are maintained.

12. The bias circuit according to claim 10, wherein the reference voltage is further related to a sum of the voltage drop between the control terminal and the second end of the first transistor, the voltage drop between the control terminal and the second end of the second transistor, and a voltage drop between the control terminal and the second end of the third transistor.

13. The bias circuit according to claim 10, wherein when the first transistor is turned on by the first voltage source, the second transistor is turned on by the second voltage source and the third transistor is turned on by the third voltage source, the voltage at the second end of the first transistor, the voltage at the second end of the second transistor and the voltage at the second end of the third transistor are larger than the voltage at the control terminal of the first transistor, larger than the voltage at the control terminal of the second transistor, and larger than the voltage at the control terminal of the third transistor.

14. The bias circuit according to claim 13, wherein the first transistor, the second transistor and the third transistor are depletion mode transistors, the first end of the first transistor, the first end of the second transistor and the first end of the third transistor are drains, the second end of the first transistor, the second end of the second transistor and the second end of the third transistor are sources, and the control terminal of the first transistor, the control terminal of the second transistor and the control terminal of the third transistor are gates.

15. The bias circuit according to claim 10, wherein the voltages of any two of the first voltage source, the second voltage source and the third voltage source are equal or unequal to each other.

16. The bias circuit according to claim 10, wherein the bias current is outputted to a load circuit from the third node.

17. The bias circuit according to claim 10, wherein the reference voltage is provided to a load circuit at the first node, the bias current is outputted to the load circuit from the third node, and the load circuit has an input end and an output end and includes:
  a fourth transistor, wherein the first end of the fourth transistor receives the bias current, the second end of the fourth transistor is coupled to a reference potential, and the control terminal of the fourth transistor is coupled to the first end of the fourth transistor and is also coupled to the input end of the load circuit; and
  a fifth transistor and a sixth transistor, wherein a control terminal of the sixth transistor is coupled to the reference voltage, a control terminal of the fifth transistor is coupled to the control terminal of the fourth transistor, a first end of the fifth transistor is coupled to a second end of the sixth transistor, a second end of the fifth transistor is coupled to the reference potential, and a first end of the sixth transistor is coupled to a fourth voltage source and is also coupled to the output end of the load circuit.

18. The bias circuit according to claim 1, wherein when the first transistor is turned on by the first voltage source and the second transistor is turned on by the second voltage source, a first current flows through the first transistor and a second current flows through the second transistor, the reference voltage is generated when the first current flows through the first resistor and the first current and the second current flow through the second resistor, and the bias circuit outputs the reference voltage.

19. The bias circuit according to claim 1, further comprising:
  a third transistor, wherein a first end of the third transistor is coupled to a third voltage source, and a second end of the third transistor is coupled to the control terminal of the second transistor; and
  a third resistor, having one end coupled to the other end of the second resistor, having the other end coupled to a control terminal of the third transistor;
  wherein when the first transistor is turned on by the first voltage source, the second transistor is turned on by the second voltage source and the third transistor is turned on by the third voltage source, a first current flows through the first transistor, a second current flows through the second transistor and a third current flows through the third transistor, the reference voltage is generated when the first current flows through the first resistor, the first current and the second current flow through the second resistor, and the first current, the second current and the third current flow through the third resistor, and the bias circuit outputs the reference voltage.

* * * * *